US012468230B2

(12) United States Patent
Erxmeyer et al.

(10) Patent No.: US 12,468,230 B2
(45) Date of Patent: Nov. 11, 2025

(54) OPTICAL COMPONENT AND OPTICAL SYSTEM, IN PARTICULAR FOR MICROLITHOGRAPHY

(71) Applicant: Carl Zeiss SMT GmbH, Oberkochen (DE)

(72) Inventors: Jeffrey Erxmeyer, Oberkochen (DE); Martin Hermann, Heidenheim (DE); Nils Lundt, Ulm (DE); Conrad Wolke, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 166 days.

(21) Appl. No.: 18/321,244

(22) Filed: May 22, 2023

(65) Prior Publication Data
US 2023/0384687 A1   Nov. 30, 2023

(30) Foreign Application Priority Data
May 24, 2022   (DE) .......................... 102022113164.5

(51) Int. Cl.
*G03F 7/20*   (2006.01)
*G03F 7/00*   (2006.01)

(52) U.S. Cl.
CPC ................................ *G03F 7/70316* (2013.01)

(58) Field of Classification Search
CPC ... G03F 7/70316; G03F 7/7015; G02B 5/283; G02B 5/00; G02B 1/10
See application file for complete search history.

(56) References Cited

U.S. PATENT DOCUMENTS

2012/0120500 A1   5/2012   Eisenkraemer et al.
2012/0224265 A1   9/2012   Clark et al.
(Continued)

FOREIGN PATENT DOCUMENTS

DE   102 48 707 A1   5/2004
EP   3111257 B1   7/2019
(Continued)

OTHER PUBLICATIONS

Extended European Search Report for corresponding EP Appl 23172459.2, dated Sep. 26, 2023.
(Continued)

*Primary Examiner* — Mesfin T Asfaw
(74) *Attorney, Agent, or Firm* — Fish & Richardson P.C.

(57) ABSTRACT

An optical component comprises a first layer system exhibiting a first wavelength-dependent reflectivity curve when electromagnetic radiation impinges thereon, and at least one second layer system exhibiting a second wavelength-dependent reflectivity curve when electromagnetic radiation impinges thereon. The first layer system and the second layer system are arranged on different optical surfaces. The wavelength dependencies of the first and the second reflectivity curve at least partially compensate one another so that the relative deviation from a desired reflectivity curve which is linear or constant with respect to the wavelength is no more than 5% within the specified wavelength range for a resultant summated reflectivity for the first layer system and the at least one second layer system. An optical system, such as a microlithography projection exposure apparatus, can include such an optical component.

20 Claims, 14 Drawing Sheets

(56) References Cited

U.S. PATENT DOCUMENTS

| | | | |
|---|---|---|---|
| 2013/0250405 A1 | 9/2013 | Kivel et al. | |
| 2014/0285783 A1* | 9/2014 | Dinger | G02B 5/0891 |
| | | | 359/359 |
| 2021/0224265 A1 | 7/2021 | Madan et al. | |

FOREIGN PATENT DOCUMENTS

| | | |
|---|---|---|
| JP | 2005-189395 A | 7/2005 |
| JP | 2008-270739 A | 11/2008 |
| JP | 2012-108508 A | 6/2012 |
| WO | WO 2008/132868 A | 11/2008 |

OTHER PUBLICATIONS

GPTO-Office Action, with translation thereof, for corresponding DE 10 2022 113 164.5 dated Nov. 29, 2022.

Japanese Office Action, with translation thereof, for corresponding JP Appl No. 2023- 085155, dated Jul. 23, 2024.

Office Action in Japanese Appln. No. 2023-085155, mailed on Apr. 17, 2025, 8 pages (with English translation).

Office Action in European Appln. No. 23172459.2, mailed on Jun. 2, 2025, 6 pages.

* cited by examiner

OPTICAL COMPONENT AND OPTICAL SYSTEM, IN PARTICULAR FOR MICROLITHOGRAPHY

CROSS-REFERENCE TO RELATED APPLICATIONS

This application claims benefit under 35 U.S.C. §119 to German Application No. 10 2022 113 164.5, filed May 24, 2022. The contents of this application is hereby incorporated by reference in its entirety.

FIELD

The disclosure relates to an optical component and an optical system. The disclosure is applicable in a laser light source, for example, but also in other applications, such as a microlithographic projection exposure apparatus.

BACKGROUND

Microlithography is used to produce microstructured, electronic components. The microlithography process is carried out in what is known as a projection exposure apparatus, which has an illumination device and a projection lens. The image of a mask (=reticle) illuminated via the illumination device is projected via the projection lens onto a substrate (for example a silicon wafer) that is coated with a light-sensitive layer (photoresist) and arranged in the image plane of the projection lens in order to transfer the mask structure to the light-sensitive coating of the substrate.

In a projection exposure apparatus designed for operation in the DUV range (e.g., at operating wavelengths of less than 250 nm, such as less than 200 nm), use is typically made of laser light sources in the form of excimer lasers, such as krypton fluoride excimer lasers at an operating wavelength of 248 nm or argon fluoride excimer lasers at an operating wavelength of 193 nm.

Existing challenges within the scope of the development of projection exposure apparatuses relate, inter alia, to ever more stringent desired properties for the accuracy for the microlithographic production of ever smaller structures and the positioning thereof on the wafer.

The material of optical components, for example in the aforementioned laser light sources but also in the illumination device, in the projection lens or in other optical systems, can degrade due to the respective ambient conditions (e.g., by being bombarded with electromagnetic radiation, ions, etc.), which can lead to changes in the respective optical properties which, in turn, can be accompanied by an impairment of the performance of the optical system comprising the relevant component.

For instance, depending on the ambient conditions, unwanted changes in the wavelength-dependent reflection or transmission curve can arise in beam splitters used in optical systems such as, for example, the aforementioned laser light sources, which changes—as indicated in the merely exemplary diagram of FIG. 13—can ultimately correspond in terms of their effect on the reflection or transmission behaviour to a shift of the effective wavelength of the electromagnetic radiation incident on the relevant component. The optical component, which in general is designed for the respective operating wavelength of the optical system (e.g., 193 nm), might then no longer exhibit its optimal behaviour in the case of this shift of the effective wavelength, with the result that the performance of the optical system can also be impaired. For example, with the aforementioned example of the laser light source, the respectively provided source power may be subjected to unwanted fluctuations.

Reference is made by way of example to EP 3 111 257 B 1.

SUMMARY OF THE DISCLOSURE

The present disclosure seeks to provide an optical component and an optical system which allow operation that is relatively stable even under varying use conditions while avoiding issues described above to at least some extent.

According to the disclosure, an optical component comprises:
  a first layer system which exhibits a first wavelength-dependent reflectivity curve when electromagnetic radiation impinges thereon; and
  at least one second layer system which exhibits a second wavelength-dependent reflectivity curve when electromagnetic radiation impinges thereon;
  wherein the first layer system and the second layer system are arranged on different optical surfaces; and
  wherein the wavelength dependencies of the first and the second reflectivity curve at least partially compensate one another in such a way that the relative deviation from a desired reflectivity curve which is linear or constant with respect to the wavelength is no more than 5% within the specified wavelength range for a resultant summated reflectivity for the first layer system and the at least one second layer system.

The disclosure involves the concept of designing the respective wavelength-dependent reflectivity curves of layer systems present on different optical surfaces of a component so that, even in the case of a drift of the respective reflectivity behaviour of the relevant layer systems, which is caused for example by the surroundings of the component, for example by contamination or degradation, the resultant summated reflectivity behaviour of the optical component remains at least largely constant or at least only deviates slightly from a desired linear reflectivity curve with respect to the wavelength.

In other words, the present disclosure allows for the approach of matching the layer systems situated on at least two optical surfaces of a component to one another, so that the respective wavelength-dependent reflectivity curves—which are consciously allowed for each individual relevant layer system—at least partially compensate one another with the result that, for the totality of the relevant layer systems or the respective optical component, a spectral drift in the reflection behaviour, which can be undesirable in view of the performance of the optical system, no longer occurs or only still occurs to a small extent.

By virtue of the disclosure allowing deliberate reversible structural changes and, accompanying these, spectral shifts in the reflection behaviour for each individual layer system of the aforementioned layer systems, it is possible as a result to ensure a stable and largely constant operation at all times even in the case of ambient conditions which are comparatively problematic in view of the risk of degradation or contamination (e.g., in the wavelength range from 100 nm to 700 nm, such as from 100 nm to 400 nm, on account of the comparatively highly energetic electromagnetic radiation and the optionally present atmosphere in the respective optical system) and also in the case of fluctuations in these ambient conditions over time, since, as described above, the relevant layer systems are in a certain sense "pitted" against one another in view of the effects of the the changes during operation.

According to the disclosure, increased outlay for the construction of the respective layer design on different surfaces of the optical component in view of mutual compensation in relation to the respective wavelength-dependent reflectivity curve even in the case of an optical system with in actual fact a constant operating wavelength (e.g., a laser light source) is consciously accepted since, in return, this construction can account for the effects of degradation or reversible structural changes within the meaning of the shift of the effective wavelength in the reflection behaviour described at the outset.

The reflectivity of the second layer system may also equal zero, in the case of which the resultant reflectivity within the specified wavelength range corresponds to the reflectivity of the first layer system.

According to an embodiment the wavelength dependencies of the first and the second reflectivity curve at least partially compensate one another in such a way that the relative deviation from a desired reflectivity curve which is linear or constant with respect to the wavelength is no more than 3%, such as no more than 2%, within the specified wavelength range for a resultant summated reflectivity for the first layer system and the at least one second layer system.

According to an embodiment, a resultant summated reflectivity for the first layer system and the at least one second layer system is constant within the specified wavelength range apart from a maximum relative variation of 5%, such as apart from a maximum relative variation of 3%, for example apart from a maximum relative variation of 2%.

According to an embodiment, a maximum variation of the reflectivity for the resultant reflectivity curve within the specified wavelength range is less than the respective maximum variation of the reflectivity, within the specified wavelength range, for the first wavelength-dependent reflectivity curve and for the second wavelength-dependent reflectivity curve.

In the first reflectivity curve of the first layer system, the reflectivity as a function of the wavelength, within the specified wavelength range, varies by at least 5%, such as by at least 10%, in relation to the maximum reflectivity according to an embodiment.

According to an embodiment, the optical component further comprises at least one third layer system with a third wavelength-dependent reflectivity curve.

For a resultant summated reflectivity for the first layer system, the second layer system and the third layer system, the relative deviation within the specified wavelength range from a desired linear reflectivity curve is no more than 5%, such as no more than 3%, for example no more than 2%, according to an embodiment.

According to an embodiment, the specified wavelength range extends for a given operating wavelength $\lambda_0$ from $0.95*\lambda_0$ to $1.05*\lambda_0$, such as from $0.9*\lambda_0$ to $1.1*\lambda_0$, for example from $0.8*\lambda_0$ to $1.2*\lambda_0$, and for example from $0.7*\lambda_0$ to $1.3*\lambda_0$.

According to an embodiment, the optical component comprises at least one beam splitter.

According to an embodiment, the optical component comprises an output coupling element for output coupling a component beam from the optical beam path of an optical system.

According to an embodiment, the optical component comprises a deflection element for deflecting a component beam in the optical beam path of an optical system.

According to an embodiment, the optical component is designed for an operating wavelength ranging from 100 nm to 700 nm.

Further, the disclosure also relates to an optical system, such as for microlithography, comprising an optical component in accordance with the above-described features. For example, the optical component can be arranged within a laser light source (without however the disclosure being restricted thereto).

Further embodiments of the disclosure are evident from the description and the dependent claims.

The disclosure will be explained in greater detail below on the basis of an exemplary embodiment that is illustrated in the accompanying figures.

DETAILED DESCRIPTION OF PREFERRED EMBODIMENTS

Embodiments of the present disclosure are explained hereinafter with reference to the diagrams in FIGS. 3A-6 and also the schematic illustrations in FIG. 2 and FIGS. 7-20 10.

What is common to the embodiments described hereinafter is that—in view of the object of avoiding a change in the optical performance occurring due to a degradation during operation of an optical component or an optical system comprising this component—at least two layer systems situated on different surfaces of the relevant optical component are matched to one another in terms of their respective wavelength-dependent reflectivity behaviour so that, in respect of the effects of a degradation or structural change, an at least partial compensation effect and, overall, a largely constant reflectivity behaviour of the optical component are obtained.

Figure 1:
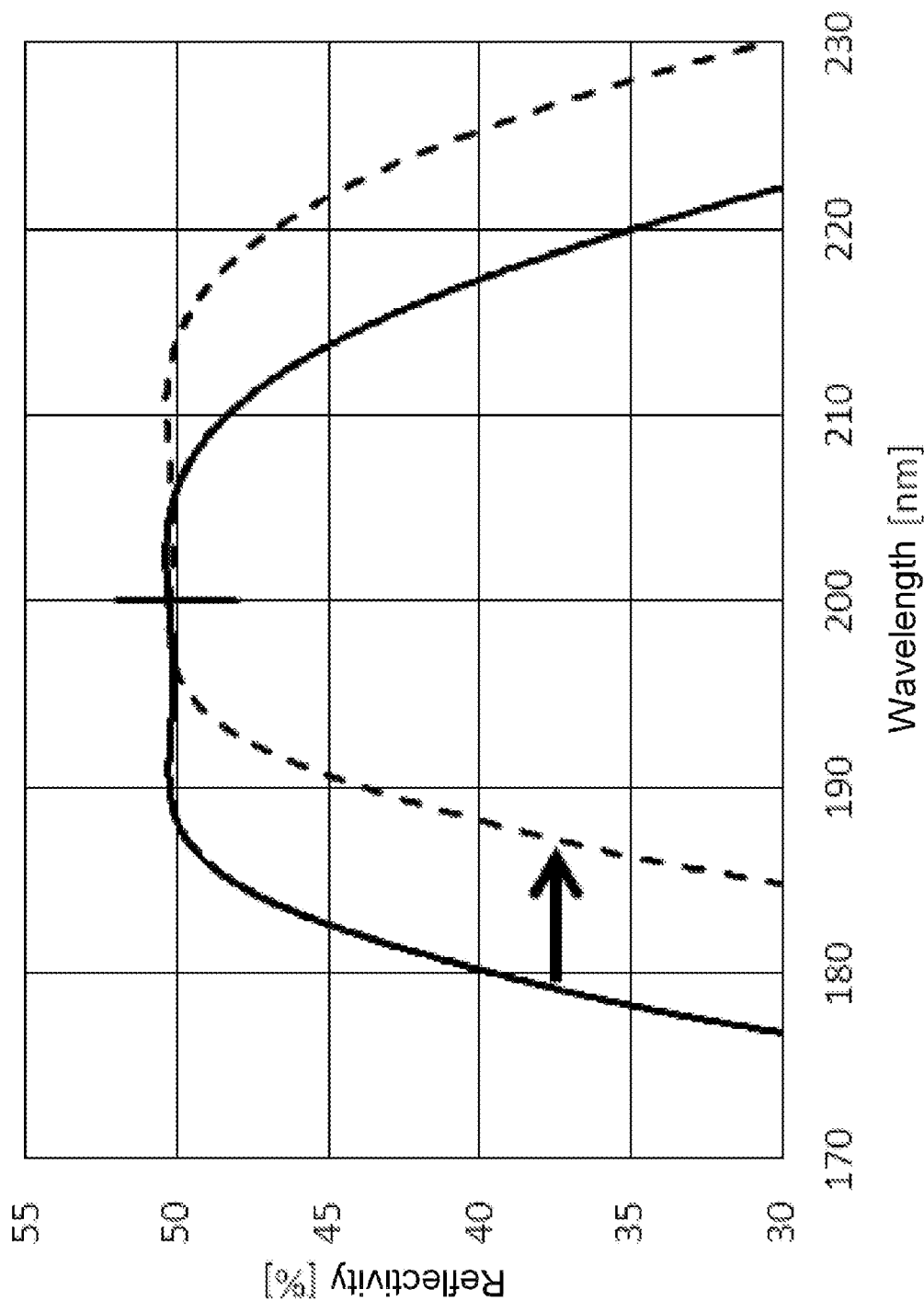
FIG. 1 shows a diagram for explaining a concept underlying the present disclosure.
Figure 2:
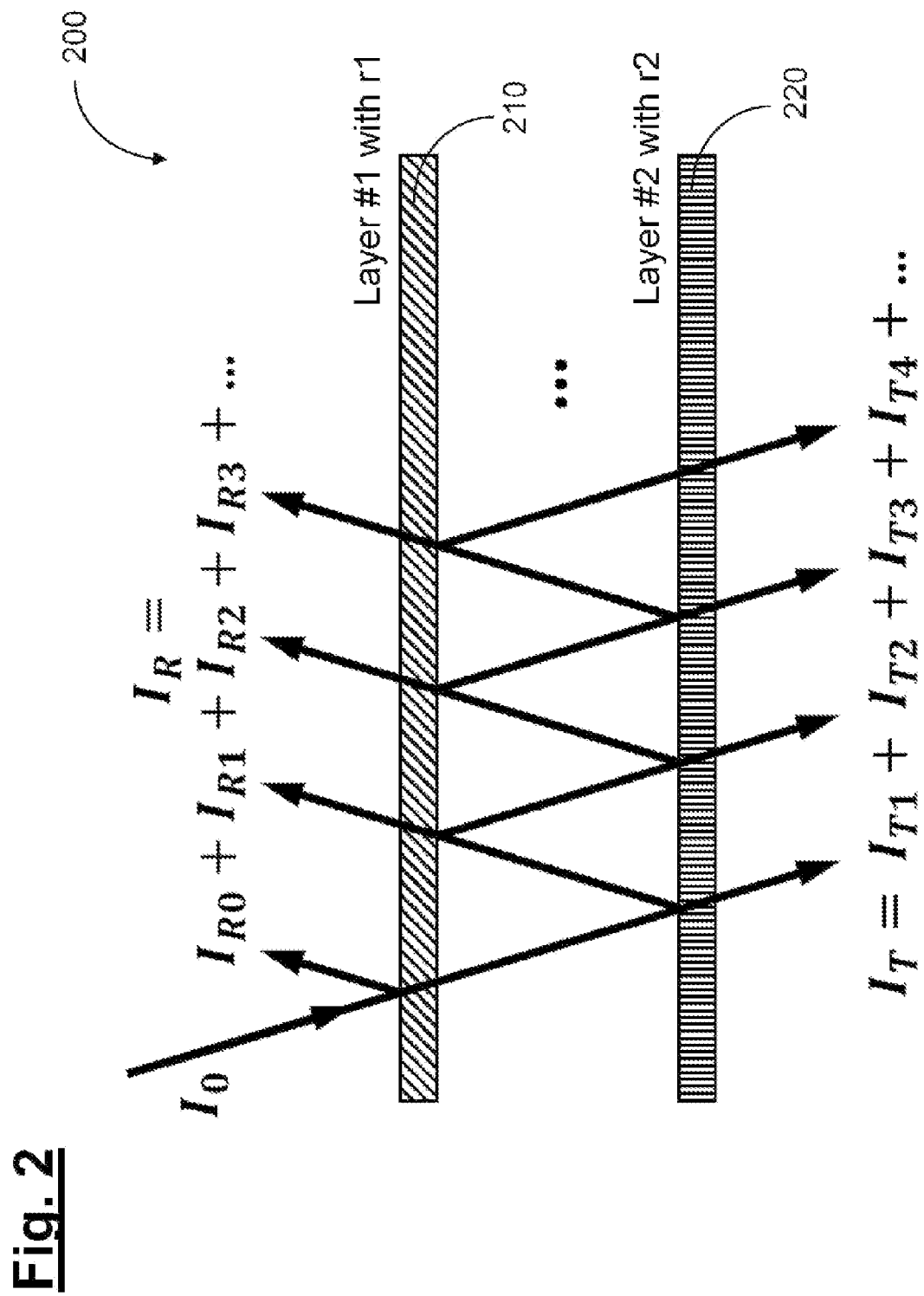
FIG. 2 shows a schematic illustration of the basic possible structure of a beam splitter in which the present disclosure can be realized.
Figure 13:
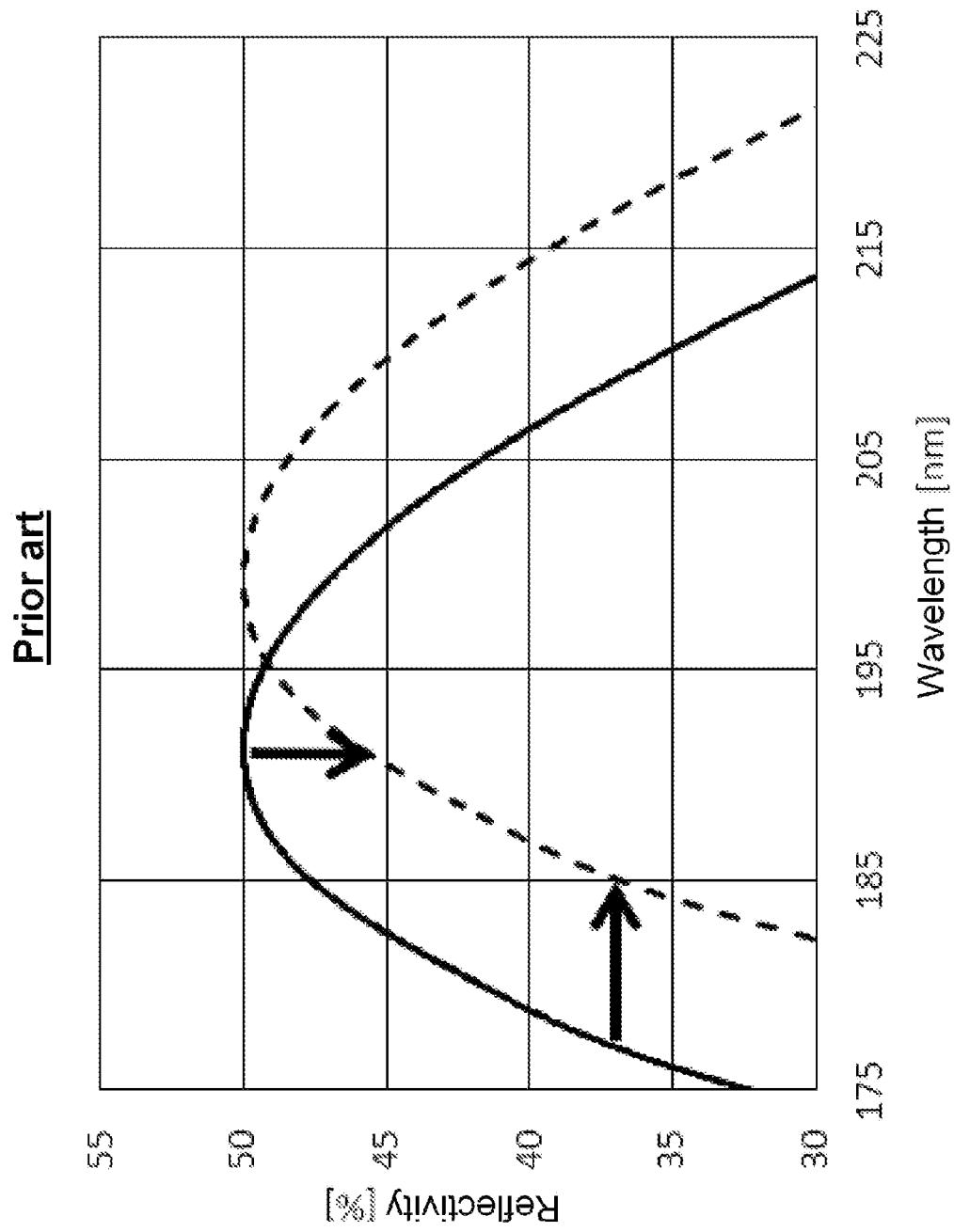
FIG. 13 shows a diagram for explaining a problem occurring in accordance with the prior art.

In so doing, the present disclosure for example proceeds from the idea that—as already explained at the outset on the basis of the diagram in FIG. 13—a degradation in the material of an optical component such as a beam splitter, for example, ultimately corresponds in terms of its effect on the reflection behaviour of the optical component to a shift of the effective wavelength which, without suitable countermeasures, is accompanied by an impairment of the performance of the relevant optical component (which of course was initially constructed in a targeted manner for the specific operating wavelength of the respective optical system). According to the disclosure, an allowance is made for these circumstances by virtue of a substantially plateau-shaped wavelength-dependent reflectivity curve for the component overall being sought after for the relevant optical component even over a relatively large wavelength range—despite its intended use only for a specific operating wavelength (of 193 nm, for example)—since, as indicated in FIG. 1, a consequence of this plateau-shaped curve is that the aforementioned degradation-related shift of the effective wavelength no longer leads to an impairment in the optical reflection behaviour.

As described below on the basis of various embodiments with reference to FIG. 2 to FIG. 10, the substantially constant performance of the optical component in view of the reflection behaviour is achieved overall according to the disclosure by virtue of at least two layer systems situated on different surfaces of the optical component having in a certain sense opposing wavelength-dependent reflectivity curves and consequently being "pitted against one another" in respect of their respective degradation effect or being matched to one another within the meaning of a mutual compensation.

For example (but without the disclosure being restricted thereto), the concept according to the disclosure can be realized in an optical component in the form of an optical beam splitter, for example as is used in a laser light source or in other optical systems, especially for microlithography. According to the purely schematic illustration in FIG. 2, such a beam splitter 200 can be constructed from a first layer system 210 and a second layer system 220, with FIG. 2 further indicating, for an incident light beam with the intensity $I_0$, the occurrence of both a reflected intensity component $I_R$ and a transmitted intensity component $I_T$. Both the overall reflectivity resulting for the beam splitter 200 and the corresponding overall transmissivity are composed of the respective properties of the two layer systems 210, 220, with the overall reflectivity arising as $$R_{overall} = r_1 + \frac{(1-r_1)^2 r_2}{1 - r_1 r_2} \quad (1)$$

if optical losses are neglected. In this case, $r_1$ and $r_2$ denote the respective partial reflectivities of the first and the second layer system 210, 220.

Figure 3A:
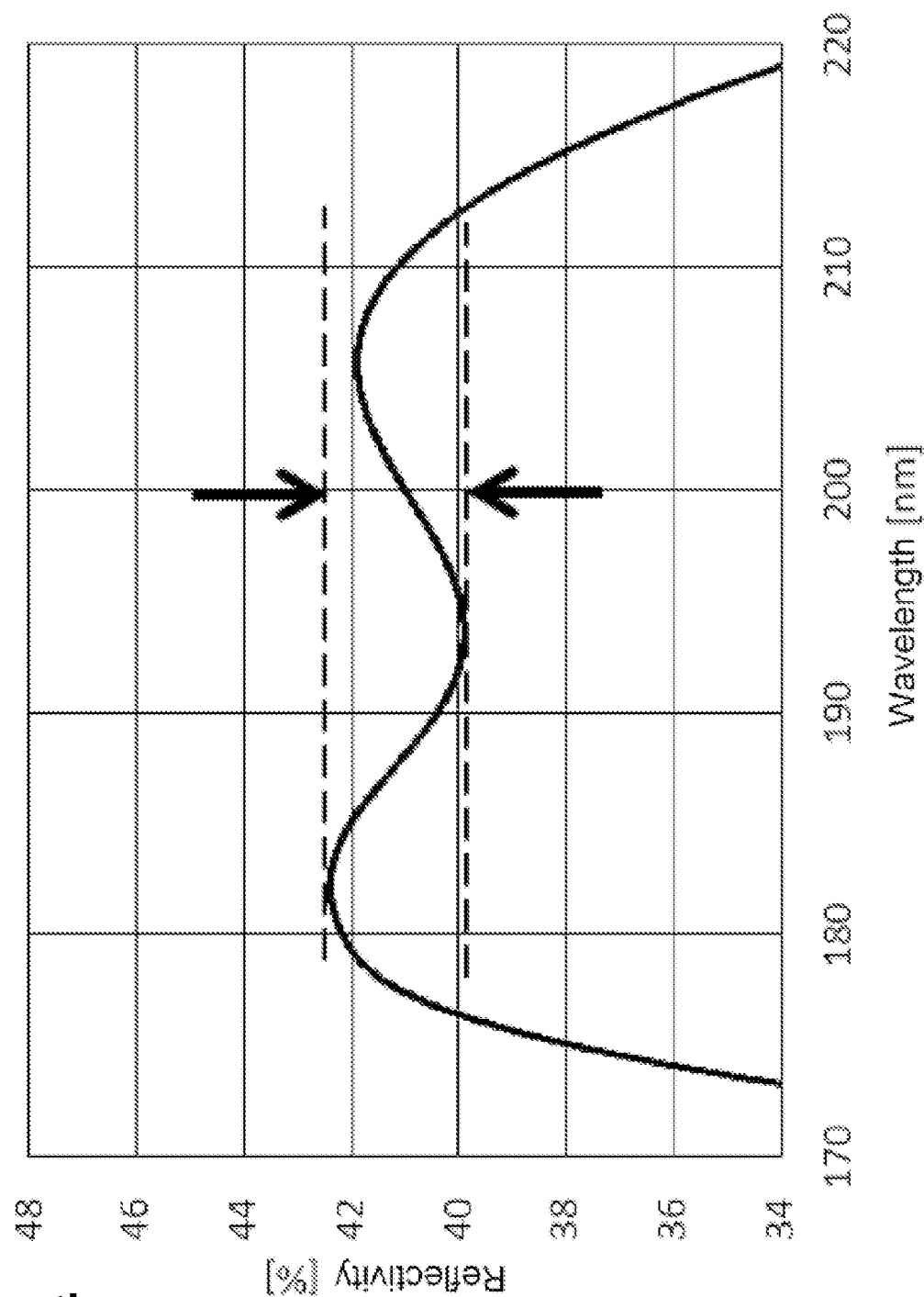
FIGS. 3A-6 show diagrams for explaining possible embodiments of the present disclosure.
Figure 3B:
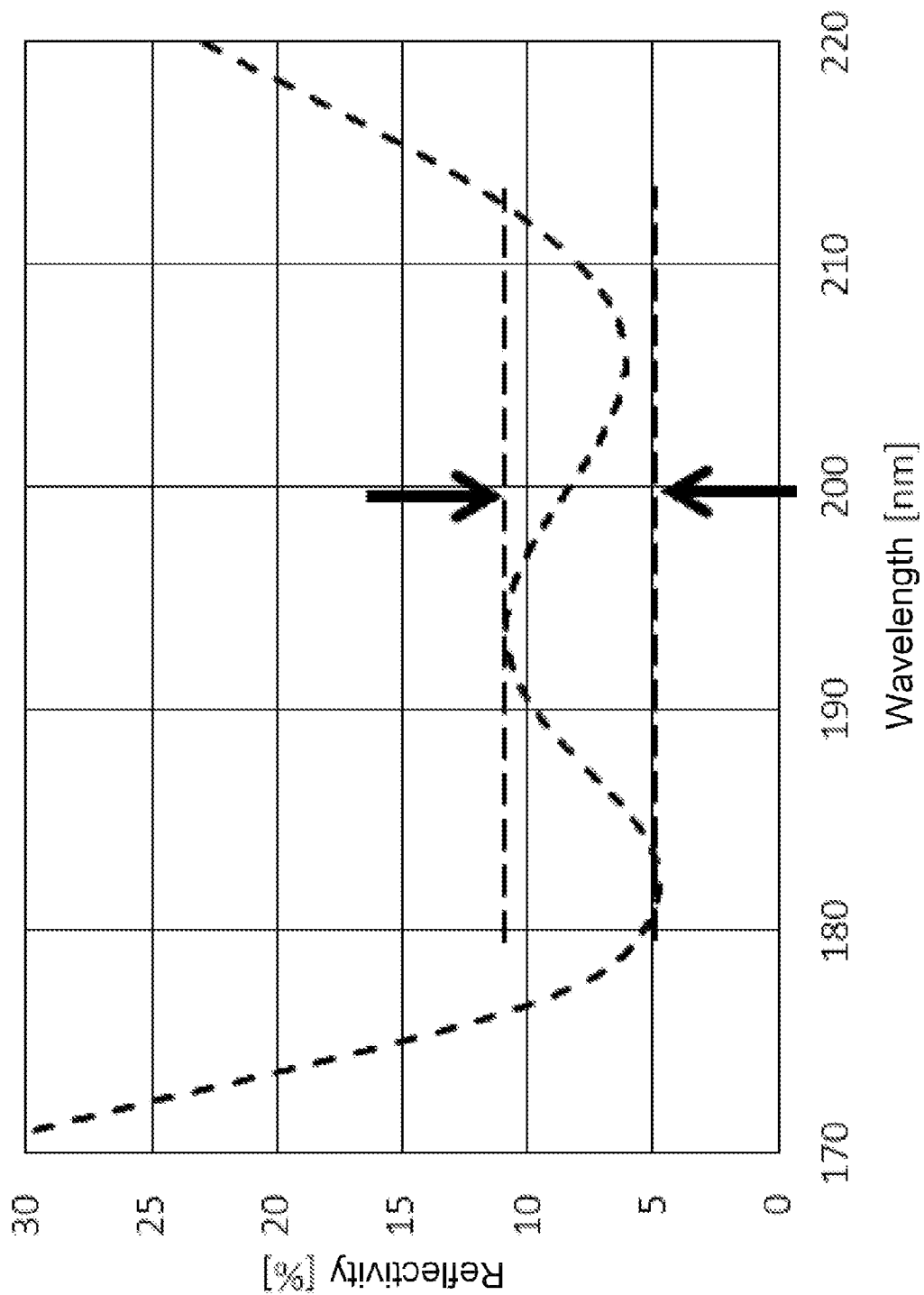

For the exemplary realization of the concept according to the disclosure, FIG. 3A now shows a possible wavelength-dependent reflectivity curve for the first layer system 210, and FIG. 3B shows a wavelength-dependent reflectivity curve for the second layer system 220 suitable according to the disclosure for obtaining the desired compensation effect. As is evident from FIGS. 3A-3B, significant variations of the individual wavelength-dependent reflectivity curves are definitely "allowed" in the process, with however these wavelength-dependent variations (including the intermediate extremals present in the specific example) running precisely counter or complementary to one another.

Figure 4:
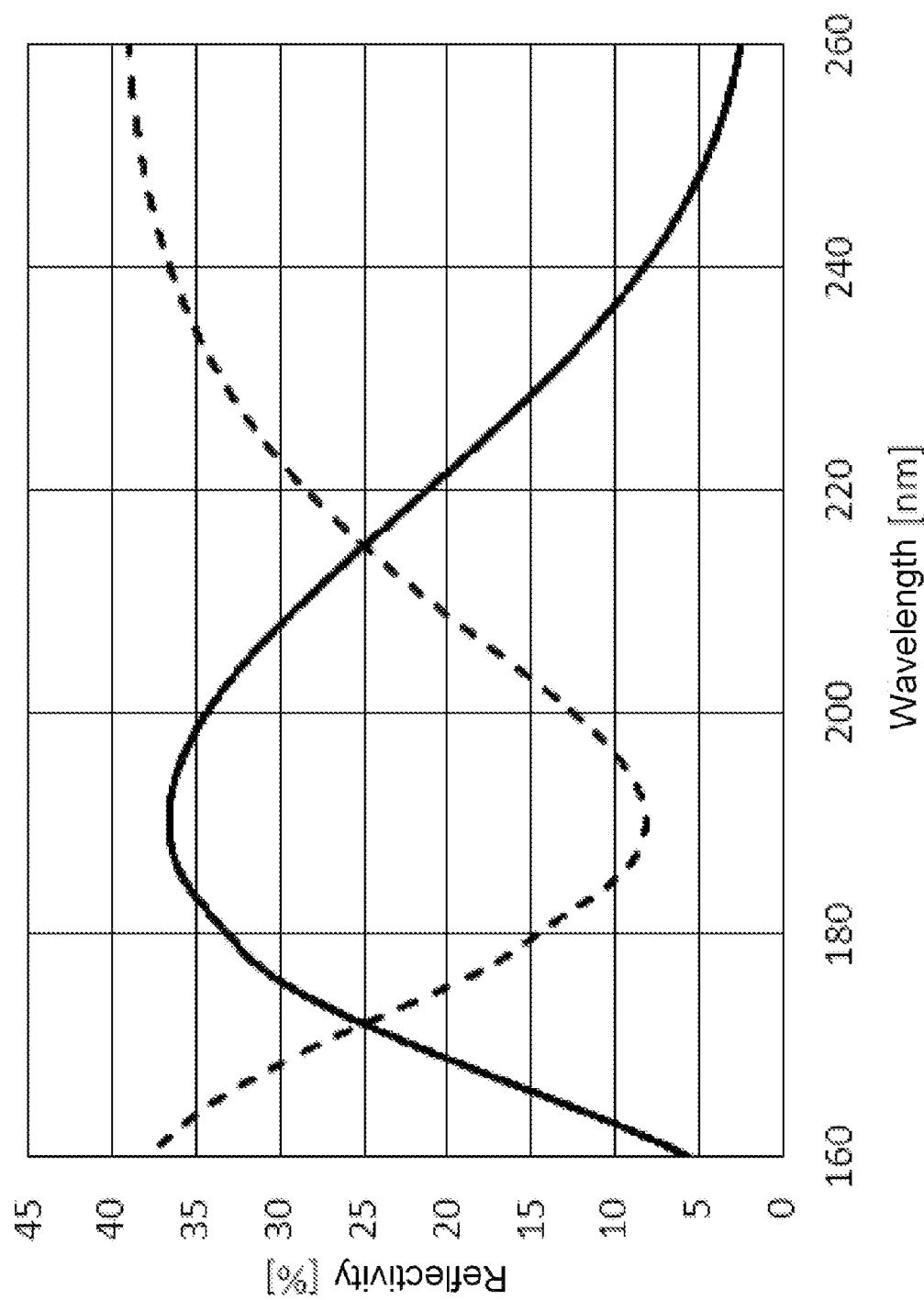

FIG. 4 shows a further example for the matching to one another according to the disclosure of two layer systems of an optical component such as an optical beam splitter, for example, with the reflectivity curve (illustrated using dashed lines) of the second layer system once again running precisely counter to the reflectivity curve (illustrated using a solid line) of the first layer system.

To illustrate a specific exemplary embodiment, Table 1 shows a possible layer design for a first layer system, and Table 2 shows a suitable layer design of a second layer system suitable for obtaining the desired compensation effect.

TABLE 1

| Material | Layer thickness [λ/4] |
|---|---|
| $LaF_3$ | 1 |
| $MgF_2$ | 1 |
| $LaF_3$ | 1 |
| $MgF_2$ | 1 |
| $LaF_3$ | 1 |

TABLE 2

| Material | Layer thickness [λ/4] |
|---|---|
| $LaF_3$ | 1.82 |
| $MgF_2$ | 1.54 |
| $LaF_3$ | 1.69 |
| $MgF_2$ | 0.99 |
| $LaF_3$ | 1.01 |
| $MgF_2$ | 1.85 |
| $LaF_3$ | 1.05 |
| $MgF_2$ | 1.02 |
| $LaF_3$ | 0.99 |

Figure 5:
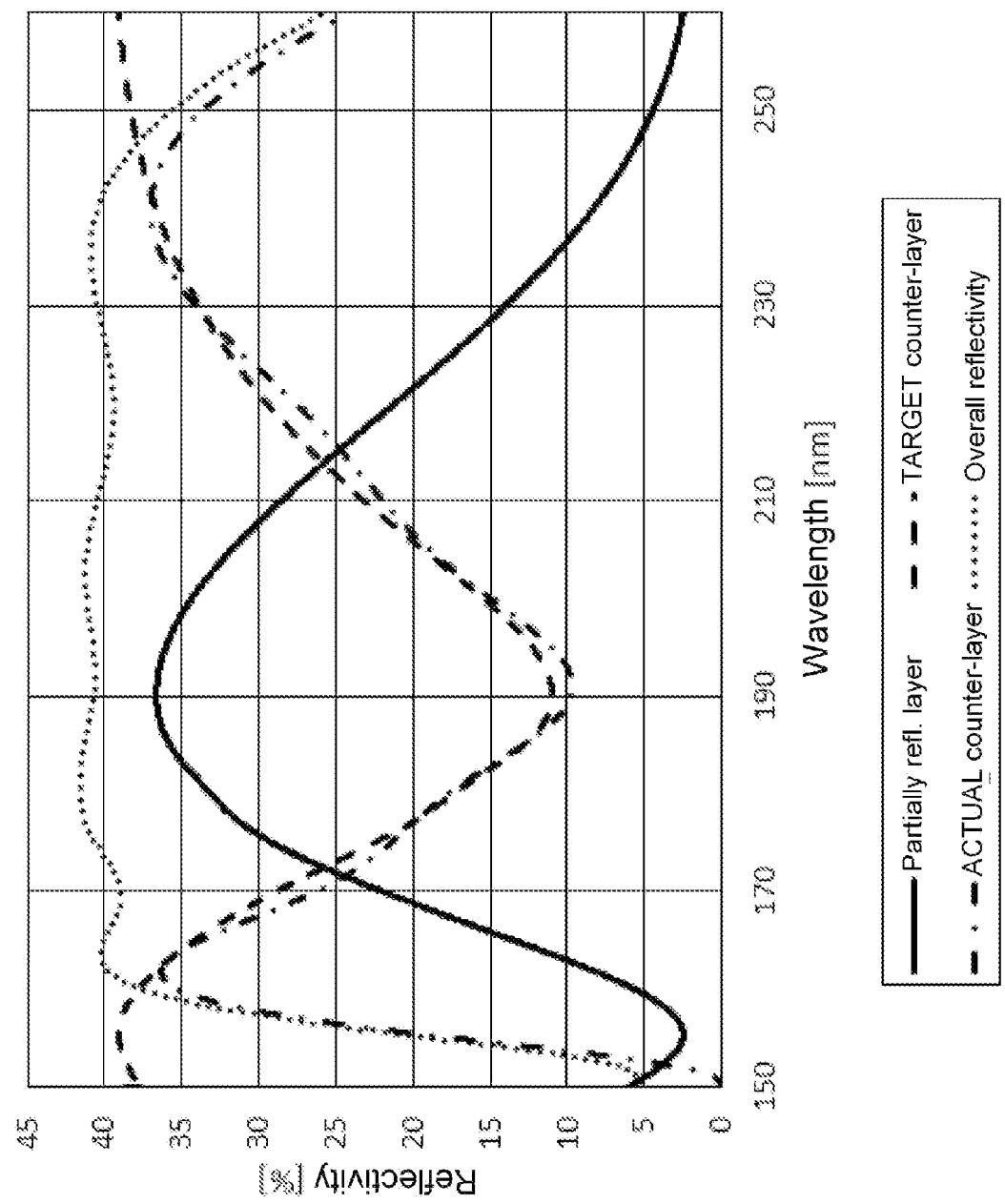

In this respect, FIG. 5 shows the corresponding wavelength-dependent reflectivity curves, with both the desired target profile for an ideal compensation effect and the actual profile in fact realized by the specific layer design being illustrated for the second layer system. As is evident from FIG. 5, a largely plateau-shaped curve over a comparatively broad wavelength range from approximately 160 nm to 240 nm is achieved for the resultant overall reflectivity.

As a further specific exemplary embodiment, Table 3 shows a further possible layer design of a first layer system, and Table 4 shows a layer design of a correspondingly matched second layer system suitable for obtaining the compensation effect according to the disclosure.

TABLE 3

| Material | Layer thickness [λ/4] |
|---|---|
| $LaF_3$ | 1 |
| $MgF_2$ | 2 |
| $LaF_3$ | 1 |
| $MgF_2$ | 1 |
| $LaF_3$ | 1 |
| $MgF_2$ | 1 |
| $LaF_3$ | 1.1 |

TABLE 4

| Material | Layer thickness [λ/4] |
|---|---|
| $LaF_3$ | 0.31 |
| $MgF_2$ | 1.25 |
| $LaF_3$ | 1.02 |
| $MgF_2$ | 1.99 |

TABLE 4-continued

| Material | Layer thickness [λ/4] |
|---|---|
| LaF$_3$ | 0.99 |
| MgF$_2$ | 1.68 |
| LaF$_3$ | 1.43 |

Figure 6:
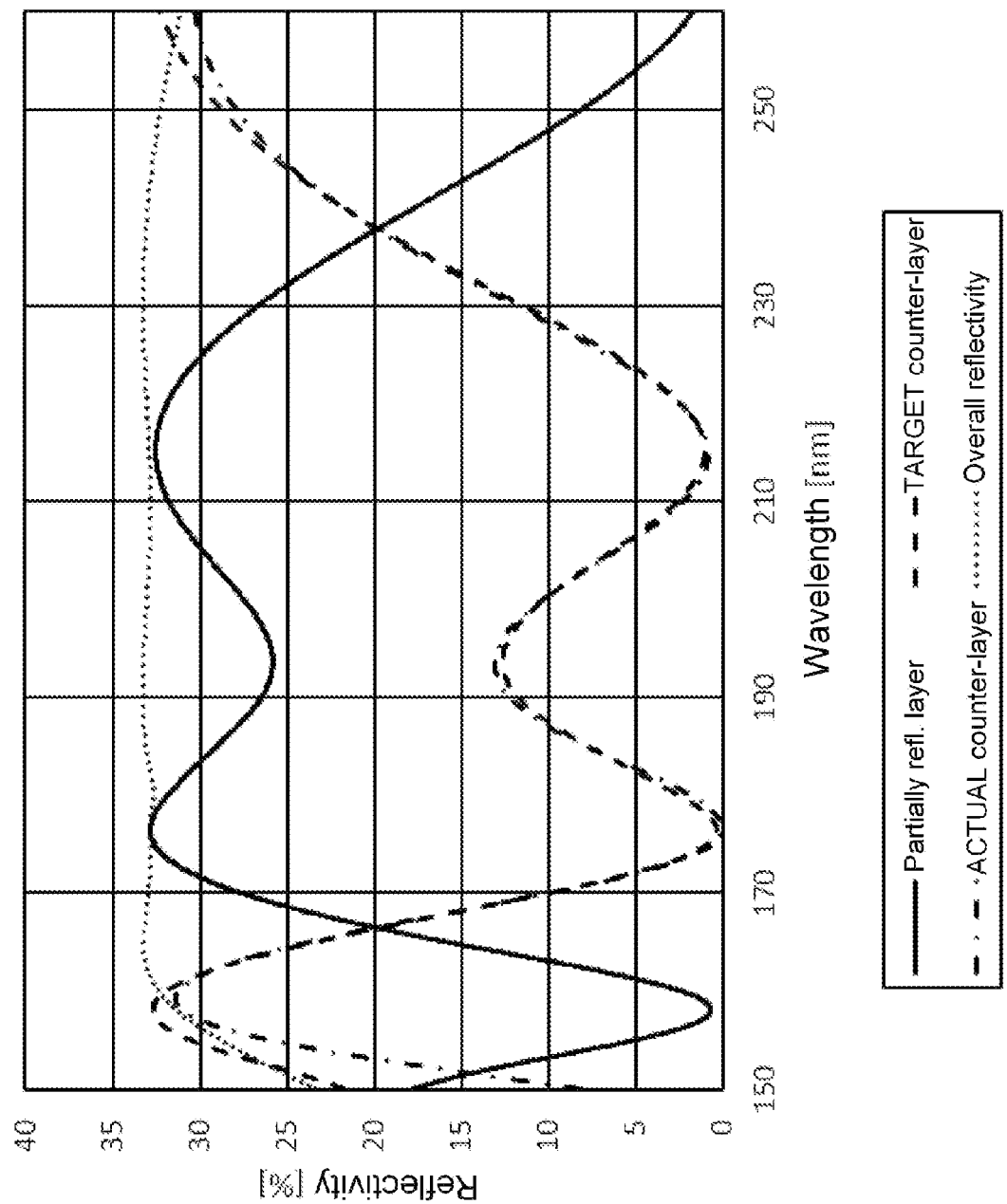

In a manner analogous to FIG. 5, FIG. 6 shows the respective wavelength-dependent reflectivity curves for the exemplary embodiment of Table 3 to Table 4.

Figure 7:
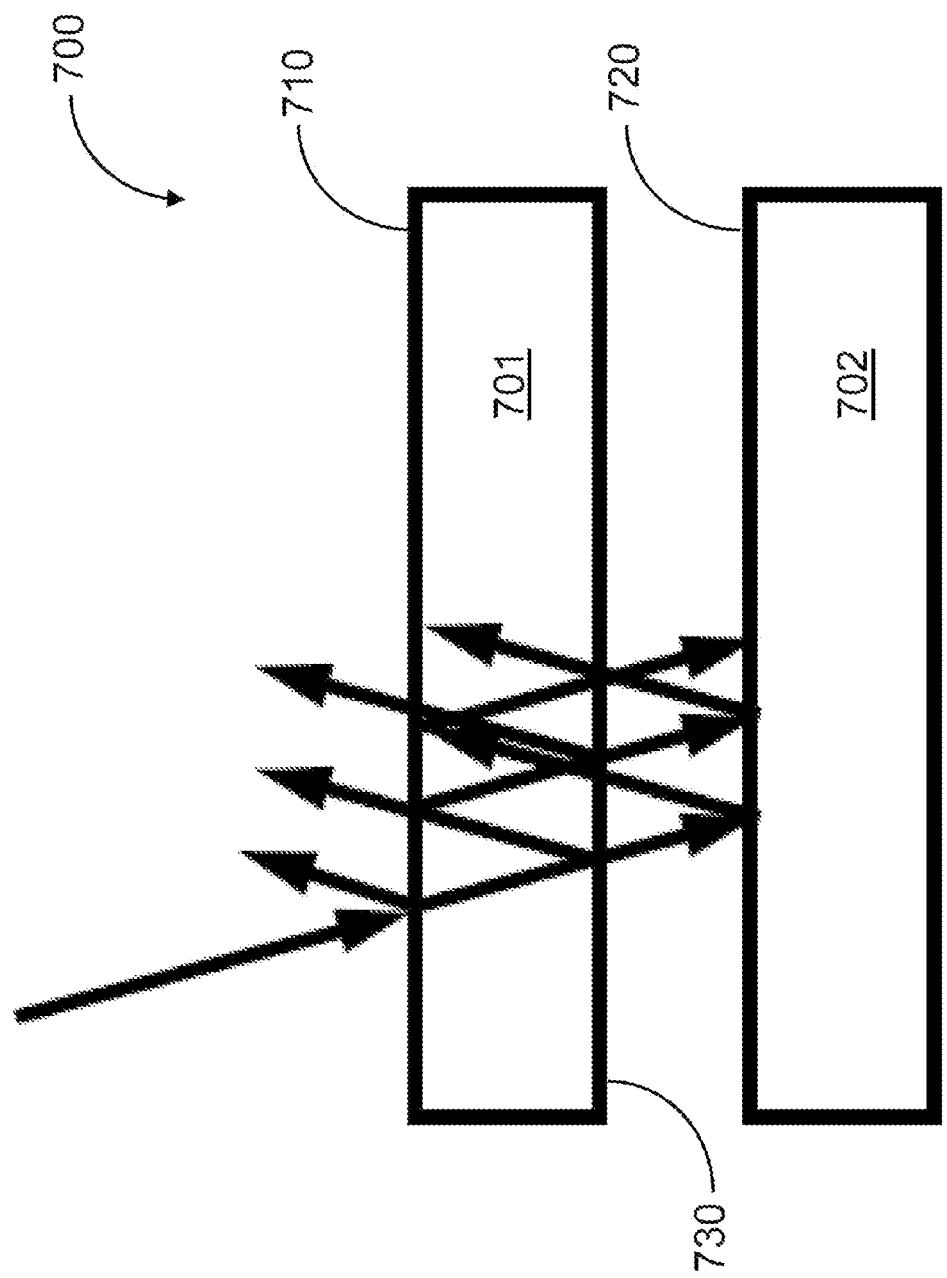
FIGS. 7-10 show schematic illustrations of exemplary optical components in which the present disclosure can be realized.

The disclosure is not restricted to the realization with two mutually matched layer systems on an optical component. FIG. 7 shows, only in a schematic illustration, an optical component 700 made up of two partial components 701, 702, with the partial component 701 yet again being an optical beam splitter and the partial component 702 being a mirror. Consequently, a total of three optically effective surfaces or layer systems 710, 720, 730 present at these surfaces are available for the component 700, which surfaces or layer systems can be matched to one another in respect of their respective wavelength-dependent reflectivity curves for the purpose of obtaining the compensation effect according to the disclosure.

Figure 8:
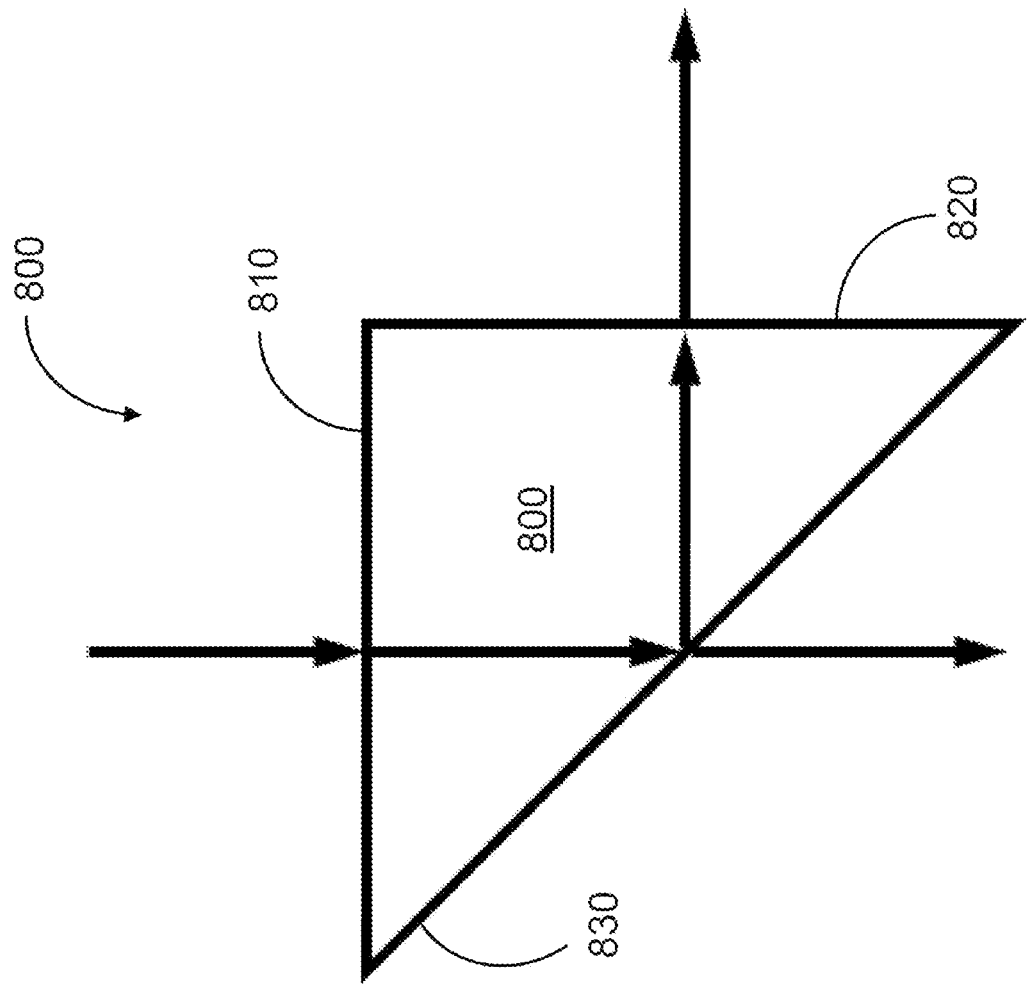

FIG. 8 shows, as a further application example, an optical component 800 with three optically effective surfaces or layer systems 810, 820, 830 situated thereon. In this case, the optical component 800 selectively acts as a deflection mirror (for the portion reflected at the layer system 830 and transmitted through the layer system 820) or as an output coupling element (for the portion transmitted through the layer system 830). In this case, depending on the specific use scenario, the layer systems 820 and 830, for example, can be matched to one another according to the disclosure in such a way that the ratio of the portions transmitted there in each case remains constant over a sufficiently broad wavelength range.

Figure 9:
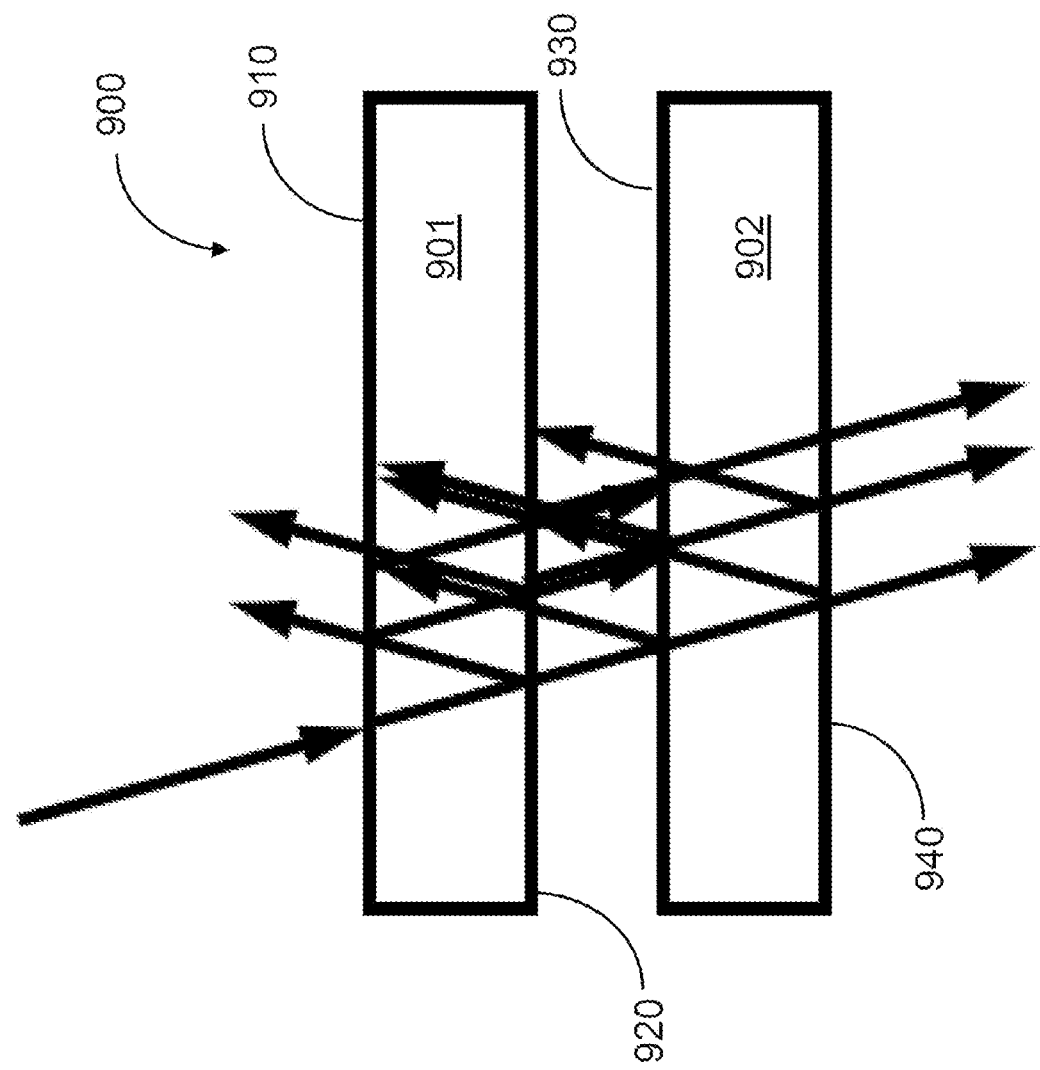

In a schematic illustration, FIG. 9 shows a further example of an optical component 900 which is made up of two partial components 901, 902, each in the form of a beam splitter. Consequently, a total of four optically effective surfaces or layer systems 910, 920, 930 and 940 situated thereon are available for the purpose of obtaining the compensation effect according to the disclosure.

Figure 10:
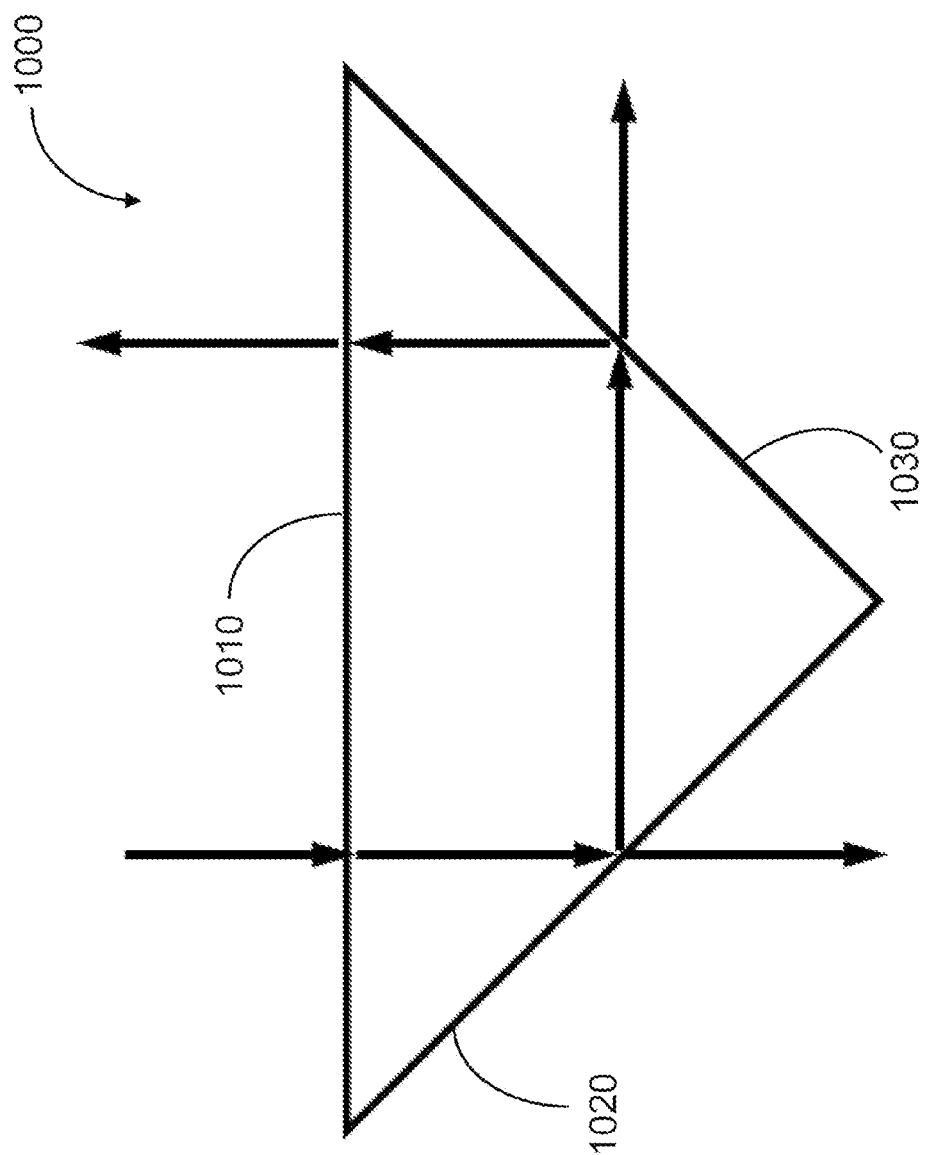

As a further possible exemplary application, FIG. 10 shows an optical component 1000 in the form of a deflection or output coupling element, wherein three different optical surfaces or layer systems 1010, 1020, 1030 situated thereon are available, of which however the layer system 1010 is passed through twice in accordance with the indicated beam path. As indicated in FIG. 10, the optical component 1000 can be used to output couple two different component beams (corresponding to the portion transmitted through the layer system 1020 and the portion transmitted through the layer system 1030). Moreover, depending on the specific use scenario, all three layer systems or else only two of these layer systems can be matched to one another, in the manner according to the disclosure, in respect of their wavelength-dependent reflectivity curve.

Figure 11:
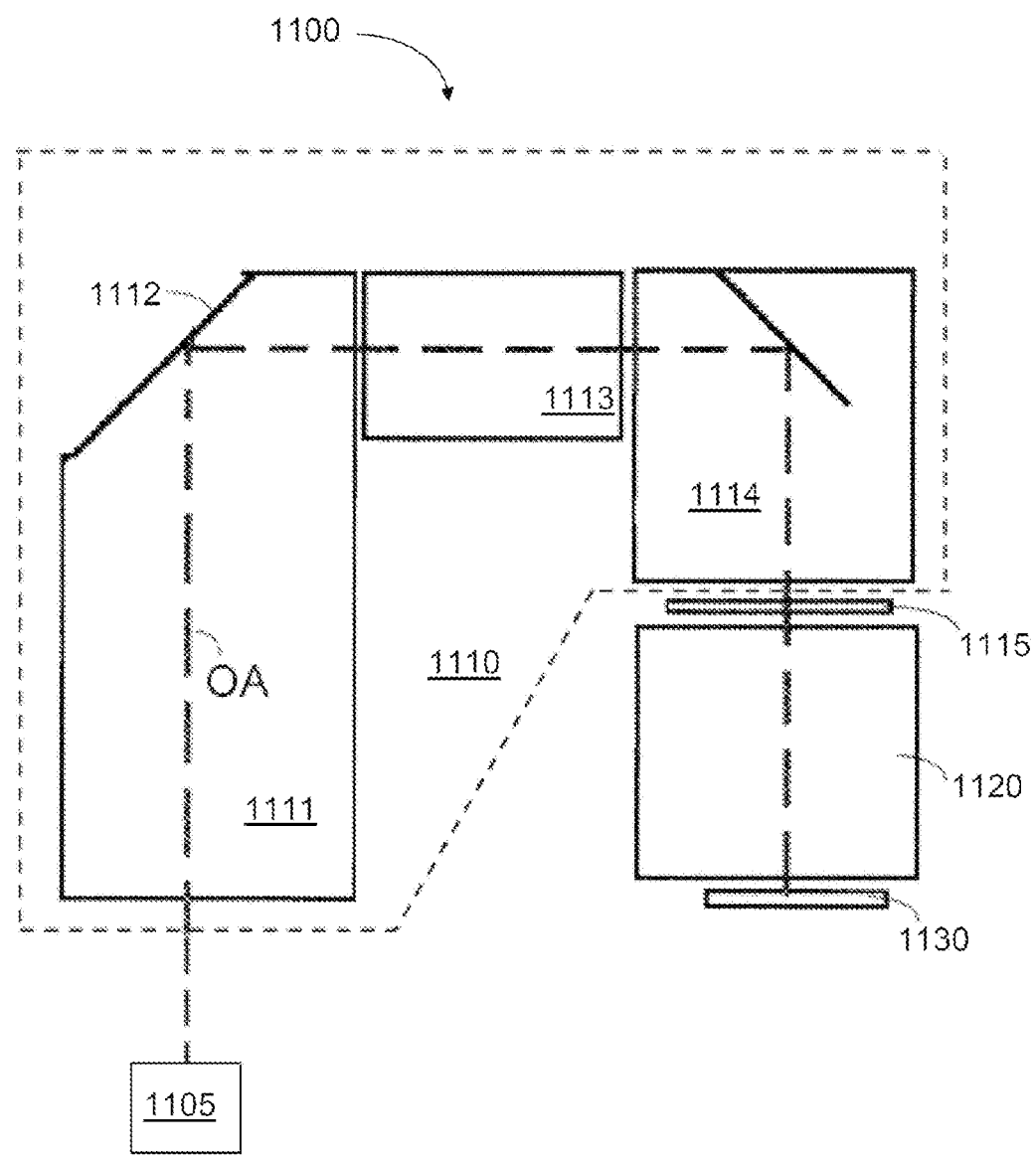
FIG. 11 shows a schematic illustration for explaining the possible structure of a microlithographic projection exposure apparatus designed for operation in the DUV.

FIG. 11 shows a structure, possible in principle, of a microlithographic projection exposure apparatus 1100 designed for operation in the DUV.

The projection exposure apparatus 1100 in accordance with FIG. 11 comprises an illumination device 1110 and a projection lens 1120. The illumination device 1110 serves for illuminating a structure-bearing mask (reticle) 1115 with light from a light source unit 1105 comprising a laser light source for example in the form of an ArF excimer laser for an operating wavelength of 193 nm (or else in the form of a KrF excimer laser for an operating wavelength of 248 nm) and also a beam shaping optical unit that generates a parallel light beam. In this case, the laser light source can be designed in the manner according to the disclosure.

The illumination device 1110 comprises an optical unit 1111 which, inter alia, comprises a deflection mirror 1112 in the example illustrated. The optical unit 1111 can comprise for example a diffractive optical element (DOE) and a zoom-axicon system for producing different illumination settings (i.e., intensity distributions in a pupil plane of the illumination device 1110). A light mixing device (not illustrated) is situated in the beam path downstream of the optical unit 1111 in the light propagation direction, which light mixing device can have for example, in a manner known per se, an arrangement composed of micro-optical elements which is suitable for attaining light mixing, and a lens-element group 1113, downstream of which there is a field plane with a reticle masking system (REMA), which is imaged by a REMA lens 1114, disposed downstream in the light propagation direction, onto the structure-bearing mask (reticle) 1115 arranged in a further field plane and which thereby delimits the illuminated region on the reticle. Via the projection lens 1120, the structure-bearing mask 1115 is imaged onto a substrate provided with a light-sensitive layer (photoresist) or onto a wafer 1130. For example, the projection lens 1120 can be designed for immersion operation, in which case an immersion medium is situated upstream of the wafer, or the light-sensitive layer thereof, in relation to the light propagation direction. Furthermore, it can have for example a numerical aperture NA greater than 0.85, for example greater than 1.1.

Figure 12B:
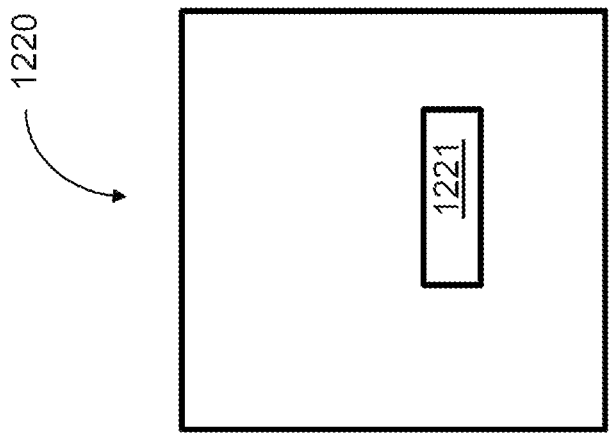
FIGS. 12A-12B show schematic illustrations of exemplary applications of the disclosure.
Figure 12A:
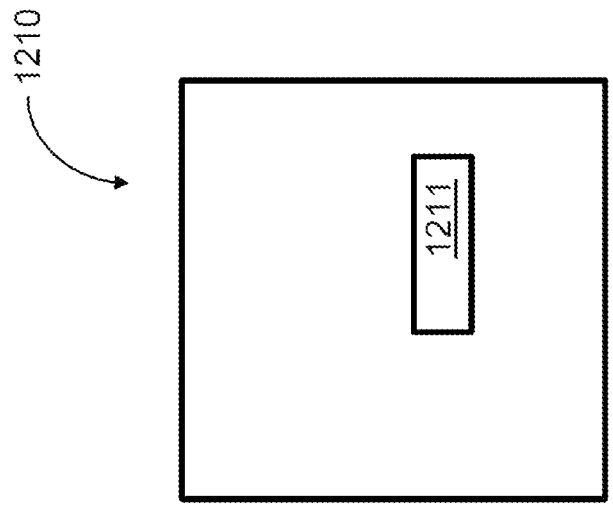

FIG. 12A indicates, purely schematically, a laser 1210 having a beam splitter 1211 inserted therein as an exemplary application of the present disclosure. By way of example, beam splitters may also be used in an optical pulse stretcher or else for the purpose of output coupling a component beam, for example for beam measurement purposes. FIG. 12B indicates, likewise purely schematically, a microscope 1220 (e.g., for wafer inspection) having a beam splitter 1221 inserted therein as a further exemplary application of the disclosure.

Even though the disclosure has also been described on the basis of specific embodiments, numerous variations and alternative embodiments will be apparent to a person skilled in the art, for example by the combination and/or exchange of features of individual embodiments. Accordingly, it goes without saying for a person skilled in the art that such variations and alternative embodiments are concomitantly encompassed by the present disclosure, and the scope of the disclosure is restricted only within the meaning of the appended patent claims and the equivalents thereof.

What is claimed is:

1. An optical component having optical surfaces, the optical component comprising:
    a first layer system configured to exhibit a first wavelength-dependent reflectivity curve when electromagnetic radiation impinges thereon; and
    a second layer system configured to exhibit a second wavelength-dependent reflectivity curve when electromagnetic radiation impinges thereon, wherein:
        the first layer system and the second layer system are on different optical surfaces of the optical element;
        for each wavelength over an entire wavelength range of from 100 nm to 700 nm, a total wavelength-dependent reflectivity curve is a sum of the first and second wavelength-dependent reflectivity curves; and over an entire wavelength range of from 160 nm to 240 nm, the total wavelength-dependent reflectivity curve deviates from a constant value by no more than 5%.

2. The optical component of claim 1, wherein, over the entire wavelength range of from 160 nm to 240 nm, the total wavelength-dependent reflectivity curve deviates from the constant value by no more than 3%.

3. The optical component of claim 1, wherein, over the entire wavelength range of from 160 nm to 240 nm, the a total reflectivity for the first layer system and the second layer system is constant apart from a maximum relative variation of 5%.

4. The optical component of claim 1, wherein, over the entire wavelength range of from 160 nm to 240 nm, a maximum variation of the total wavelength-dependent reflectivity curve is less than a respective maximum variation of the reflectivity for the first wavelength-dependent reflectivity curve and for the second wavelength-dependent reflectivity curve.

5. The optical component of claim 1, wherein, over the entire wavelength range of from 160 nm to 240 nm, a reflectivity of the first wavelength-dependent reflectivity curve varies by at least 5% relative to a maximum reflectivity of the first wavelength-dependent reflectivity curve.

6. The optical component of claim 1, wherein the optical component further comprises a third layer system having a third wavelength-dependent reflectivity curve.

7. The optical component of claim 6, wherein, over the entire wavelength range of from 160 nm to 240 nm, a resultant summated reflectivity for the first, second and third layer systems deviates by no more than 5% relative to the constant value.

8. The optical component of claim 1, wherein the optical component comprises a beam splitter.

9. The optical component of claim 1, wherein the optical component comprises an output coupling element configured to output couple a component beam from an optical beam path of an optical system.

10. The optical component of claim 1, wherein the optical component comprises a deflection element configured to deflect a component beam in an optical beam path of an optical system.

11. An optical system, comprising:
an optical component according to claim 1,
wherein the optical system is a microlithography optical system.

12. The optical component of claim 1, wherein, for each wavelength over the entire wavelength range from 160 nm to 240 nm, so that:
the first layer system is configured to reflect a first portion of electromagnetic radiation at the wavelength, the first portion of electromagnetic radiation being greater than zero;
the first layer system is configured to reflect a second portion of electromagnetic radiation at the wavelength, the second portion of electromagnetic radiation being greater than zero;
the second layer system is configured to reflect a third portion of electromagnetic radiation at the wavelength, the third portion of electromagnetic radiation being greater than zero; and the second layer system is configured to reflect a fourth portion of electromagnetic radiation at the wavelength, the fourth portion of electromagnetic radiation being greater than zero.

13. An optical component having first and second optical surfaces, the optical component comprising:
a first layer system configured to exhibit a first wavelength-dependent reflectivity curve when electromagnetic radiation impinges thereon; and
a second layer system configured to exhibit a second wavelength-dependent reflectivity curve when electromagnetic radiation impinges thereon,
wherein:
the first optical surface is different from the second optical surface;
the first layer system is supported by the first optical surface;
the second layer system is supported by the second optical surface;
for each wavelength over an entire wavelength range of from 100 nm to 700 nm, a total wavelength-dependent reflectivity curve is a sum of the first and second wavelength-dependent reflectivity curves; and
over the entire wavelength range of from 160 nm to 240 nm, the total wavelength-dependent reflectivity curve deviates from a constant value no more than 5%.

14. The optical component of claim 13, wherein, over the entire wavelength range of from 160 nm to 240 nm, the first and second wavelength-dependent reflectivity curves at least partially compensate each other so that the relative deviation from the constant value is no more than 3% for the total wavelength-dependent reflectivity curve.

15. The optical component of claim 13, wherein, wavelength range of from 160 nm to 240 nm, the total wavelength-dependent reflectivity curve has a maximum relative variation of at most 5% from being constant.

16. The optical component of claim 13, wherein, over the entire wavelength range of from 160 nm to 240 nm:
a maximum variation of a reflectivity for the total wavelength-dependent reflectivity curve is less than a maximum variation of a reflectivity for the first wavelength-dependent reflectivity curve; and
the maximum variation of a reflectivity for the total wavelength-dependent reflectivity curve is less than a maximum variation of a reflectivity for the second wavelength-dependent reflectivity curve.

17. The optical component of claim 13, wherein, over the entire wavelength range of from 160 nm to 240 nm, a reflectivity of the first wavelength-dependent reflectivity curve varies by at least 5% from a maximum reflectivity of the first wavelength-dependent reflectivity curve.

18. The optical component of claim 13, wherein:
the optical component further comprises a third layer system having a third wavelength-dependent reflectivity curve; and
over the entire wavelength range of from 160 nm to 240 nm, a resultant summated reflectivity for the first, second and third layer systems deviates by no more than 5% from the constant value.

19. An optical system, comprising:
an optical component according to claim 13,
wherein the optical system is a microlithography optical system.

20. The optical component of claim 13, wherein, for each wavelength over the entire wavelength range from 160 nm to 240 nm, so that:

the first layer system is configured to reflect a first portion of electromagnetic radiation at the wavelength, the first portion of electromagnetic radiation being greater than zero;

the first layer system is configured to reflect a second portion of electromagnetic radiation at the wavelength, the second portion of electromagnetic radiation being greater than zero;

the second layer system is configured to reflect a third portion of electromagnetic radiation at the wavelength, the third portion of electromagnetic radiation being greater than zero; and the second layer system is configured to reflect a fourth portion of electromagnetic radiation at the wavelength, the fourth portion of electromagnetic radiation being greater than zero.

* * * * *

UNITED STATES PATENT AND TRADEMARK OFFICE
CERTIFICATE OF CORRECTION

| | | |
|---|---|---|
| PATENT NO. | : 12,468,230 B2 | Page 1 of 1 |
| APPLICATION NO. | : 18/321244 | |
| DATED | : November 11, 2025 | |
| INVENTOR(S) | : Jeffrey Erxmeyer et al. | |

It is certified that error appears in the above-identified patent and that said Letters Patent is hereby corrected as shown below:

In the Specification

Column 2, Line 66, delete "the the" and insert -- the --.

Column 4, Line 42, delete "7-20 10." and insert -- 7-10. --.

In the Claims

Column 9, Line 12, in Claim 3, delete "the a" and insert -- a --.

Signed and Sealed this
Thirtieth Day of December, 2025

John A. Squires
*Director of the United States Patent and Trademark Office*